(12) United States Patent
McCordic et al.

(10) Patent No.: US 11,032,947 B1
(45) Date of Patent: Jun. 8, 2021

(54) TAILORED COLDPLATE GEOMETRIES FOR FORMING MULTIPLE COEFFICIENT OF THERMAL EXPANSION (CTE) ZONES

(71) Applicant: Raytheon Company, Waltham, MA (US)

(72) Inventors: Craig H. McCordic, Medfield, MA (US); Joseph R. Ellsworth, West Boylston, MA (US); Todd E. Southard, Bolton, MA (US); Ethan S. Heinrich, Westborough, MA (US); Dimitry Zarkh, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/792,681

(22) Filed: Feb. 17, 2020

(51) Int. Cl.
*H05K 7/20* (2006.01)
*H01L 23/373* (2006.01)
(Continued)

(52) U.S. Cl.
CPC ..... *H05K 7/20518* (2013.01); *H01L 23/3675* (2013.01); *H01L 23/3735* (2013.01);
(Continued)

(58) Field of Classification Search
CPC .......... H05K 7/20518; H05K 7/20472; H05K 7/20481; H05K 7/20509; H05K 1/0203;
(Continued)

(56) References Cited

U.S. PATENT DOCUMENTS 3,156,091 A   11/1964  Kraus
3,980,105 A    9/1976  Myskowski
(Continued)

FOREIGN PATENT DOCUMENTS

EP   1783833 A2   5/2007
JP   2000150743 A  5/2000
(Continued)

OTHER PUBLICATIONS

Barcena et al., "Novel Copper/Carbon Nanofibres Composites for High Thermal Conductivity Electronic Packaging," Materials Science, 2005, 8 pages.
(Continued)

*Primary Examiner* — Zachary Pape

(57) ABSTRACT

An apparatus includes a coldplate configured to be thermally coupled to a structure to be cooled and to remove thermal energy from the structure. The coldplate includes (i) first and second outer layers having at least one first material and (ii) a third layer embedded in the outer layers and having at least one second material. The first and second materials have different coefficients of thermal expansion (CTEs). The third layer is embedded non-uniformly in the outer layers so that different zones of the coldplate have different local CTEs. The third layer may include openings extending through the second material(s), and projections of the first material(s) from at least one of the first and second outer layers may partially or completely fill the openings. The first and second outer layers may include aluminum or an aluminum alloy, and the third layer may include aluminum silicon carbide or thermal pyrolytic graphite.

20 Claims, 6 Drawing Sheets

(51) Int. Cl.
*H01L 23/367* (2006.01)
*H05K 1/02* (2006.01)
*H01L 25/07* (2006.01)
*H01L 25/065* (2006.01)

(52) U.S. Cl.
CPC ........ *H05K 1/0203* (2013.01); *H01L 23/3736* (2013.01); *H01L 25/0655* (2013.01); *H01L 25/072* (2013.01); *H05K 7/20481* (2013.01); *H05K 7/20509* (2013.01); *H05K 2201/066* (2013.01); *H05K 2201/068* (2013.01)

(58) Field of Classification Search
CPC ........ H05K 2201/066; H05K 2201/068; H01L 25/0655; H01L 25/072; H01L 23/373–3738; H01L 23/3675
See application file for complete search history.

(56) References Cited

U.S. PATENT DOCUMENTS

| | | | |
|---|---|---|---|
| 4,057,610 A | 11/1977 | Goettler et al. | |
| 4,283,464 A * | 8/1981 | Hascoe | F28F 13/14 165/185 |
| 4,627,472 A | 12/1986 | Goettler et al. | |
| 4,672,472 A | 6/1987 | Sugiyama | |
| 4,996,115 A * | 2/1991 | Eerkes | B32B 15/015 257/E23.112 |
| 5,241,450 A | 8/1993 | Bernhardt et al. | |
| 5,434,362 A | 7/1995 | Klosowiak et al. | |
| 5,545,924 A | 8/1996 | Contolatis et al. | |
| 6,075,701 A | 6/2000 | Ali et al. | |
| 6,215,661 B1 * | 4/2001 | Messenger | H05K 7/20418 165/185 |
| 6,387,462 B1 | 5/2002 | Blain et al. | |
| 6,498,551 B1 | 12/2002 | Ammar et al. | |
| 6,538,872 B1 | 3/2003 | Wang et al. | |
| 6,674,347 B1 | 1/2004 | Maruhashi et al. | |
| 6,717,813 B1 | 4/2004 | Gamer | |
| 7,005,584 B2 | 2/2006 | Levi et al. | |
| 7,066,244 B2 * | 6/2006 | Chen | H01L 23/36 165/185 |
| 7,303,005 B2 | 12/2007 | Reis et al. | |
| 7,391,382 B1 | 6/2008 | Mason et al. | |
| 8,780,561 B2 | 7/2014 | Danello et al. | |
| 9,093,442 B1 | 7/2015 | Huynh et al. | |
| 9,172,145 B2 | 10/2015 | Puzella et al. | |
| 9,190,342 B2 | 11/2015 | Paolella | |
| 9,318,450 B1 | 4/2016 | Reza et al. | |
| 9,889,624 B2 | 2/2018 | Trulli | |
| 9,942,975 B2 | 4/2018 | Elliott et al. | |
| 9,978,698 B1 | 5/2018 | Trulli et al. | |
| 10,232,582 B2 | 3/2019 | Trulli | |
| 2002/0006523 A1 | 1/2002 | Obeshaw | |
| 2002/0167800 A1 | 11/2002 | Smalc | |
| 2003/0034861 A1 | 2/2003 | Ammar et al. | |
| 2003/0042153 A1 | 3/2003 | Farrar et al. | |
| 2003/0116312 A1 | 6/2003 | Krassowski et al. | |
| 2006/0096740 A1 | 5/2006 | Zheng | |
| 2007/0053168 A1 | 3/2007 | Sayir et al. | |
| 2007/0115076 A1 | 5/2007 | Khazanov | |
| 2007/0204972 A1 | 9/2007 | Edward et al. | |
| 2007/0262836 A1 | 11/2007 | Voss | |
| 2008/0096310 A1 | 4/2008 | Modi et al. | |
| 2009/0066420 A1 | 3/2009 | Lopez | |
| 2009/0091892 A1 | 4/2009 | Otsuka et al. | |
| 2010/0177796 A1 | 7/2010 | Miller | |
| 2011/0030924 A1 | 2/2011 | Kawabata et al. | |
| 2012/0063097 A1 | 3/2012 | Reza et al. | |
| 2013/0092354 A1 | 4/2013 | Semenov et al. | |
| 2013/0208434 A1 | 8/2013 | Alm | |
| 2013/0271905 A1 | 10/2013 | Sullivan | |
| 2013/0308274 A1 | 11/2013 | Murdock et al. | |
| 2015/0062802 A1 | 3/2015 | Grunow et al. | |
| 2015/0253089 A1 * | 9/2015 | Fan | H05K 3/4602 165/185 |
| 2015/0382509 A1 | 12/2015 | Nagata et al. | |
| 2016/0049351 A1 | 2/2016 | McCann | |
| 2016/0081227 A1 * | 3/2016 | Lee | G06F 1/20 165/185 |
| 2016/0276242 A1 | 9/2016 | Trulli | |
| 2016/0316570 A1 | 10/2016 | De Vaan et al. | |
| 2017/0042058 A1 | 2/2017 | Pope et al. | |
| 2017/0100907 A1 | 4/2017 | Trulli | |
| 2017/0284647 A1 | 10/2017 | Morin et al. | |
| 2017/0325332 A1 | 11/2017 | Long et al. | |
| 2019/0295918 A1 | 9/2019 | Trulli et al. | |
| 2019/0313522 A1 | 10/2019 | Trulli et al. | |
| 2020/0091035 A1 | 3/2020 | Gupta et al. | |

FOREIGN PATENT DOCUMENTS

| | | |
|---|---|---|
| JP | 2001267441 A | 9/2001 |
| JP | 2004153075 A | 5/2004 |
| WO | 2011008467 A1 | 1/2011 |

OTHER PUBLICATIONS

Darwish et al., "Three Dimensional Transmission Lines and Power Divider Circuits", 4th International Conference on Design Technology of Integrated Systems in Nanoscale Era, Apr. 2009, 7 pages.

Gries, "Photonics Applied: Microelectronics Processing: Laser direct structuring creates low-cost 3D integrated circuits", Oct. 2010, 8 pages.

Tehrani et al., "Inkjet-Printed 3D Interconnects for Millimeter-Wave System-on-Package Solutions", IEEE/MTT-S International Microwave Symposium—MTT 2016, May 2016, 4 pages.

Whelan et al., "GaN Technology for Radars", CS Mantech Conference, Apr. 2012, 4 pages.

International Search Report and Written Opinion of the International Searching Authority in connection with International Patent Application No. PCT/US2019/050854 dated Nov. 22, 2019, 9 pages.

International Search Report and Written Opinion of the International Searching Authority in connection with International Application No. PCT/US2021/012773 dated May 4, 2021, 8 pages.

* cited by examiner

US 11,032,947 B1

TAILORED COLDPLATE GEOMETRIES FOR FORMING MULTIPLE COEFFICIENT OF THERMAL EXPANSION (CTE) ZONES

TECHNICAL FIELD

This disclosure is generally directed to thermal management systems. More specifically, this disclosure is directed to tailored coldplate geometries for forming multiple coefficient of thermal expansion (CTE) zones.

BACKGROUND

Thermal management systems are routinely used in electronic devices to remove heat from and thereby cool electronic components or other components in the devices. The ability to efficiently remove thermal energy from electronic devices may be necessary or desirable in a number of applications. For example, in applications that use high-power monolithic microwave integrated circuits (MMICs), insulated-gate bipolar transistors (IGBTs), field programmable gate arrays (FPGAs), system in package (SiP), ball grid arrays (BGAs), or other high-power electronic components, it is often necessary to remove heat from the electronic components in order to ensure that the components operate properly and are not damaged by excessive temperatures. Also, mounting materials that are used to mount the electronic components on substrates or other carriers typically have to be carefully selected in order to avoid excessive mechanical stresses created due to different coefficients of thermal expansion (CTE).

SUMMARY

This disclosure relates to tailored coldplate geometries for forming multiple coefficient of thermal expansion (CTE) zones.

In a first embodiment, an apparatus includes a coldplate configured to be thermally coupled to a structure to be cooled and to remove thermal energy from the structure. The coldplate includes (i) first and second outer layers having at least one first material and (ii) a third layer embedded in the first and second outer layers and having at least one second material. The first and second materials have different CTEs. The third layer is embedded non-uniformly in the first and second outer layers so that different zones of the coldplate have different local CTEs.

In a second embodiment, a system includes an electronic device having a substrate and multiple electronic components in or on the substrate. The system also includes a coldplate thermally coupled to the substrate and configured to remove thermal energy from the substrate. The coldplate includes (i) first and second outer layers having at least one first material and (ii) a third layer embedded in the first and second outer layers and having at least one second material. The first and second materials have different CTEs. The third layer is embedded non-uniformly in the first and second outer layers so that different zones of the coldplate have different local CTEs.

In a third embodiment, a method includes obtaining a coldplate with (i) first and second outer layers having at least one first material and (ii) a third layer embedded in the first and second outer layers and having at least one second material. The first and second materials have different CTEs. The third layer is embedded non-uniformly in the first and second outer layers so that different zones of the coldplate have different local CTEs. The method also includes thermally coupling the coldplate to a structure to be cooled, where the coldplate is configured to remove thermal energy from the structure.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
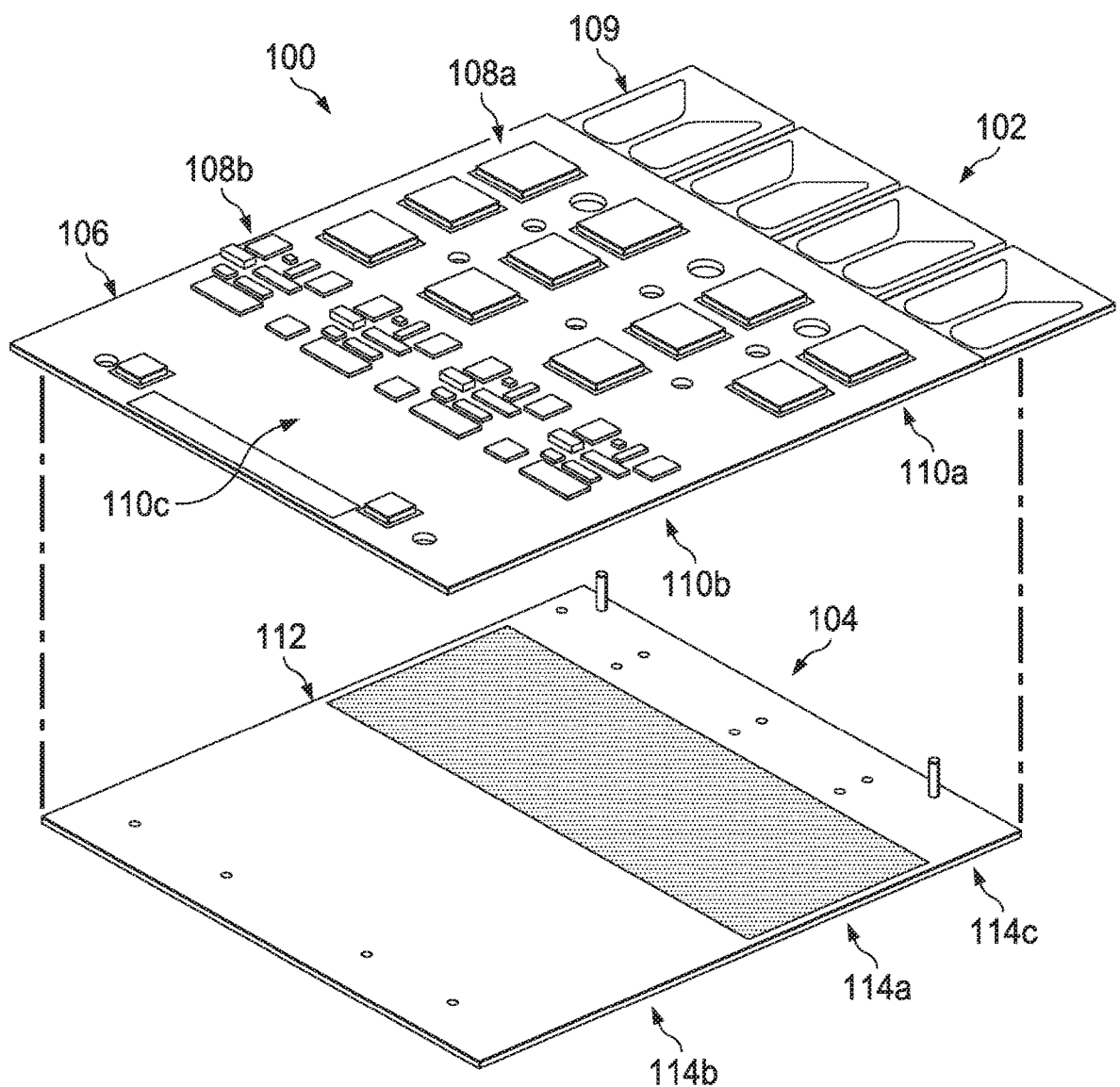
FIG. 1 illustrates an example device using a tailored coldplate geometry with multiple coefficient of thermal expansion (CTE) zones according to this disclosure.

FIGS. 1 through 4, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, thermal management systems are routinely used in electronic devices to remove heat from and thereby cool electronic components or other components in the devices. For example, in applications that use high-power monolithic microwave integrated circuits (MMICs), insulated-gate bipolar transistors (IGBTs), field programmable gate arrays (FPGAs), system in package (SiP), ball grid arrays (BGAs), or other high-power electronic components, it is often necessary to remove heat from the electronic components in order to ensure that the components operate properly and are not damaged by excessive temperatures. Also, mounting materials that are used to mount the electronic components on substrates or other carriers typically have to be carefully selected in order to avoid excessive mechanical stresses created due to different coefficients of thermal expansion (CTE).

One common technique used to cool MMICs, IGBTs, FPGAs, SiPs, BGAs, or other electronic components involves mounting a circuit board, circuit card, or other substrate carrying the electronic components on a base that functions as a thermal spreader, meaning the base receives thermal energy from the electronic components and spreads the thermal energy over a large area. The thermal energy can then be removed from the thermal spreader more easily. As a particular example, a circuit board, circuit card, or other substrate carrying electronic components may be mounted on a solid copper base or other solid metal base. Unfortunately, these types of thermal spreaders are often heavy and can be relatively expensive. The weight of the thermal spreaders may be particularly problematic in weight-sensitive devices or systems, especially when numerous thermal spreaders are used to help cool a large number of electronic components.

Moreover, it may be necessary or desirable to closely match the CTE of a thermal spreader to the CTE of a circuit board, circuit card, or other substrate carrying one or more electronic components. The coefficient of thermal expansion defines the rate at which a material expands or contracts due to changes in temperature. Mismatches between the CTE of a thermal spreader and the CTE of a substrate can cause stresses to develop between the thermal spreader and the substrate, which may eventually result in damage. For instance, CTE mismatches can result in peeling or delamination between the thermal spreader and the substrate. While it is common to closely match a thermal spreader's bulk CTE to a substrate's CTE, this still allows different stresses to develop in different areas since the substrate may not have a uniform temperature throughout the substrate.

This disclosure provides various techniques for tailoring coldplate geometries to form thermal spreaders having multiple CTE zones. As described in more detail below, a thermal spreader (also often referred to as a coldplate) is tailored so that different regions or zones of the thermal spreader have different CTEs, which allows the thermal spreader to more closely match the actual expansion or contraction of different regions or zones of a circuit board, circuit card, or other substrate carrying one or more components to be cooled (such as one or more MMICs, IGBTs, FPGAs, SiPs, BGAs, or other electronic components). For instance, a thermal spreader may have a smaller CTE in one or more regions where the thermal spreader will be attached to one or more regions of a substrate expected to reach higher temperatures, such as at least one region where the substrate carries more components or components that operate at or generate higher temperatures. The thermal spreader may also have a larger CTE in one or more regions where the thermal spreader will be attached to one or more regions of the substrate expected to reach lower temperatures, such as at least one region where the substrate carries fewer or no components or components that operate at or generate lower temperatures.

The tailoring of a thermal spreader's CTE in different regions can be accomplished in various ways. For example, a material having a lower CTE may be embedded non-uniformly between layers of material having a higher CTE (or vice versa). Various characteristics of the embedded material, such as location, amount, size, shape, dimensions, or composition, may be controlled in order to control how the CTE of the thermal spreader varies in different regions. Also or alternatively, various characteristics of the layers of material, such as dimensions or composition, may be controlled in order to control how the CTE of the thermal spreader varies in different regions. Effectively, this allows the CTE of a thermal spreader to be tailored to certain values in localized areas of the thermal spreader while maintaining a desired bulk CTE for the overall thermal spreader.

The ability to tailor a thermal spreader so that the thermal spreader has different CTEs in different regions can help to reduce or minimize stresses that may cause damage, such as peeling and delamination, and to reduce or minimize bond-line thickness needed to secure a substrate to the thermal spreader. For example, one or more regions of a substrate may reach higher temperatures, such as due to the number(s) and/or type(s) of electronic component(s) carried by the one or more regions of the substrate. If a thermal spreader has a uniform CTE throughout, the higher temperatures in the one or more regions of the substrate may cause the thermal spreader to expand more in some areas and less in other areas, which can create significant stresses. By tailoring a thermal spreader so that the thermal spreader has a lower CTE in one or more regions expected to reach higher temperatures and/or a higher CTE in one or more regions expected to reach lower temperatures, stresses caused by CTE mismatches can be significantly reduced or minimized. Moreover, this can be achieved in a lightweight and cost-effective manner, and high thermal performance designs can be achieved based on suitable tailoring of thermal spreaders. In addition, the tailoring of the CTEs in a thermal spreader is highly customizable, and various parameters may be used to control or alter the CTE of the thermal spreader in different areas.

FIG. 1 illustrates an example device 100 using a tailored coldplate geometry with multiple CTE zones according to this disclosure. As shown in FIG. 1, the device 100 generally includes a circuit card assembly 102 and a thermal spreader or coldplate 104. The circuit card assembly 102 generally includes one or more electronic components or other components that are cooled by removing thermal energy from the circuit card assembly 102 using the coldplate 104. Note, however, that the coldplate 104 may be used to cool any other suitable component or components.

In the example shown in FIG. 1, the circuit card assembly 102 includes a circuit board, circuit card, or other substrate 106, which is used to carry various electronic components 108a-108b and electrical connections between or involving the electronic components 108a-108b. The substrate 106 represents any suitable structure in or on which electrical components and electrical pathways can be formed or placed. For example, the substrate 106 may represent a rigid printed circuit board, a flexible circuit board, or any other suitable structure used to carry electrical components and conductive traces or other conductive pathways. The substrate 106 may be formed from any suitable material(s), such as cotton paper, woven fiberglass, or woven glass and epoxy resin, carbon, metal, alumina or other ceramic, or polytetrafluoroethylene, polyimide, polyester, or other polymer. Also, the substrate 106 may be formed in any suitable manner, such as by using a single layer of material or by using multiple layers of material that are laminated or otherwise joined together. In addition, the substrate 106 may have any suitable size, shape, and dimensions. As a particular example, the substrate 106 may have a square shape with sides that are about 5 inches (about 12.7 centimeters) in length.

The substrate 106 may be used to carry any suitable number(s) and type(s) of electronic components 108a-108b. In this example, the electronic components are generally divided into higher-power or higher-temperature electronic components 108a and lower-power or lower-temperature electronic components 108b. The electronic components 108a generally represent semiconductor chips, integrated circuits, or other components that operate using larger amounts of electrical power or that otherwise generate larger amounts of thermal energy to be removed from the device 100 (relative to the electronic components 108b). As a particular example, the electronic components 108a may include one or more MIMIC chips, IGBTs, FPGAs, SiPs, BGAs, or other high-power or high-performance electronic components. The electronic components 108b generally represent semiconductor chips, integrated circuits, or other components that operate using smaller amounts of electrical power or that otherwise generate smaller amounts of thermal energy to be removed from the device 100 (relative to the electronic components 108a). As a particular example, the electronic components 108*b* may include one or more passive or active electrical components, such as those that consume less power than MMICs, IGBTs, FPGAs, SiPs, and BGAs.

Note that the division of the electronic components into the electronic components 108*a* and the electronic components 108*b* is for illustration only. Any number of electronic components 108*a* and any number of electronic components 108*b* may be used in the device 100, and the electronic components 108*a*-108*b* may have any suitable arrangement on the substrate 106. Also note that the electronic components in the device 100 may be divided into more than two groups, such as when the electronic components are divided into low-power, intermediate-power, and high-power devices or low-temperature, intermediate-temperature, and high-temperature devices.

The substrate 106 may also be coupled to one or more additional components. In this example, the substrate 106 may be coupled to various antennas 109, all of which are coupled to and extend from one side of the substrate 106 in this particular embodiment (although the antennas 109 may be coupled to the substrate 106 in any other suitable manner). Each antenna 109 may be electrically coupled to at least one electronic component 108*a*-108*b*, such as one or more MMICs, IGBTs, FPGAs, SiPs, BGAs, or other electronic components. Note, however, that any other or additional components may be coupled to the substrate 106 or to the electronic components 108*a*-108*b* carried by the substrate 106, or the device 100 may include no other components coupled to the substrate 106.

Due to the presence of different quantities or types of devices in the circuit card assembly 102, different regions or zones 110*a*-110*c* of the substrate 106 may experience different temperatures (and possibly significantly different temperatures) during operation of the circuit card assembly 102. In this example, for instance, one zone 110*a* of the substrate 106 may experience the highest temperatures (relative to the other zones 110*b*-110*c*) since the zone 110*a* represents the portion of the substrate 106 carrying the higher-power or higher-temperature electronic components 108*a*. Another zone 110*b* of the substrate 106 may experience intermediate temperatures (relative to the other zones 110*a* and 110*c*) since the zone 110*b* represents the portion of the substrate 106 carrying the lower-power or lower-temperature electronic components 108*b*. A third zone 110*c* of the substrate 106 may experience the lowest temperatures (relative to the other zones 110*a*-110*b*) since the zone 110*c* represents the portion of the substrate 106 carrying fewer if any electronic components.

Note that the zones 110*a*-110*c* shown in FIG. 1 are based on the specific electronic components 108*a*-108*b* and the specific arrangement of those electronic components 108*a*-108*b* on the substrate 106. Other implementations of the circuit card assembly 102 can alter the electronic components 108*a*-108*b* used and the arrangement of the electronic components 108*a*-108*b* on the substrate 106, and the zones and the arrangement of zones in a device or system can vary in any given implementation. Also, there is no requirement that a circuit card assembly 102 include all three types of zones 110*a*-110*c*, such as when a substrate 106 is completely filled with electronic components 108*a*-108*b* and lacks a zone 110*c* of any significant size.

The coldplate 104 includes a base 112 that is connected (at least thermally) to the circuit card assembly 102 and that removes thermal energy from the circuit card assembly 102. The base 112 of the coldplate 104 can also be coupled to another device or system that removes thermal energy from the coldplate 104. Thermal energy can be removed from the base 112 in any suitable manner, such as via conduction, convection, or radiation. The base 112 may have any suitable size, shape, and dimensions. As a particular example, the base 112 may have a square shape with sides that are about 5 inches (about 12.7 centimeters) in length, and the base 112 may have a thickness of about 0.1 inches (about 2.54 millimeters). In some instances, the base 112 generally has the same size and shape as the substrate 106, although this need not be the case. The coldplate 104 may be attached to the circuit card assembly 102 in any suitable manner. For example, the base 112 of the coldplate 104 may be attached to the substrate 106 of the circuit card assembly 102 using a thermally conductive adhesive, bonding through a process such as lamination, or attached to the circuit card assembly 102 in any other suitable manner.

As described briefly above, the heating of different zones 110*a*-110*c* of the substrate 106 can cause various problems when the circuit card assembly 102 is attached to the coldplate 104 and then placed into operation. Among other things, the heating of different zones 110*a*-110*c* to different temperatures can cause different portions of the coldplate 104 to be heated to different temperatures, as well. If the coldplate 104 simply has a bulk CTE that matches the CTE of the substrate 106, the temperature differences in the different portions of the coldplate 104 can cause the different portions of the coldplate 104 to expand/contract at different rates. This can create stresses on the circuit card assembly 102 and the coldplate 104, which may cause peeling, delamination, or other damage.

In accordance with this disclosure, the coldplate 104 is tailored so that at least two regions or zones 114*a*-114*c* of the coldplate 104 have at least two different local CTEs. Overall, the base 112 of the coldplate 104 may have a bulk CTE that matches or substantially matches the CTE of the substrate 106. However, the CTE of the base 112 may differ locally in different zones 114*a*-114*c* of the coldplate 104. In this particular example, for instance, each of the zones 114*b*-114*c* may have a CTE that is matched or substantially matched to the CTE of the substrate 106, and the zone 114*a* may have a CTE that is less than the CTE of the substrate 106 but that is matched or substantially matched to the CTE of the higher-power or higher-temperature electronic components 108*a* (which in this example have a lower CTE than the substrate 106). Because the higher-power or higher-temperature electronic components 108*a* may heat the zone 114*a* of the coldplate 104 more during operation compared to the heating of the other zones 114*b*-114*c*, the zone 114*a* of the coldplate 104 can be designed to have a lower CTE compared to the other zones 114*b*-114*c*. Even though this means the zone 114*a* expands at a slower rate when heated compared to the other zones 114*b*-114*c*, the zone 114*a* is heated more compared to the other zones 114*b*-114*c*. Ideally, the CTEs of the zones 114*a*-114*c* can be selected to reduce or minimize stresses between the coldplate 104 and the circuit card assembly 102 over the expected operational temperature range of the device 100.

The CTE of the base 112 in the coldplate 104 may be tailored in any suitable manner. For example, as discussed in more detail below, a material having a lower CTE may be embedded non-uniformly between layers of material having a higher CTE (or vice versa). As particular examples, aluminum silicon carbide (AlSiC) or thermal pyrolytic graphite (TPG) may be embedded non-uniformly between layers of aluminum (Al) or an aluminum alloy, where the aluminum silicon carbide or thermal pyrolytic graphite has a smaller CTE compared to the aluminum or aluminum alloy. Various forms of these different materials exist and may be used in the coldplate 104. For instance, different forms of aluminum silicon carbide include AlSiC-9, AlSiC-10, and AlSiC-12, and different forms of aluminum alloy include alloys such as A356 aluminum alloy. The particular materials used may depend (at least in part) on the CTEs to be obtained in the coldplate 104. Thus, the location, amount, size, shape, dimensions, or composition of the base 112 can vary in different ways to achieve desired CTEs in different zones 114a-114c of the coldplate 104. Additional details regarding example tailorable designs for coldplates are provided below.

The coldplate 104 may be formed from any suitable materials, such as aluminum silicon carbide or thermal pyrolytic graphite and aluminum or aluminum alloy. Note, however, that the coldplate 104 may be formed from any other suitable materials having different CTEs. Also, the coldplate 104 may be fabricated in any suitable manner. For instance, the coldplate 104 may be fabricated as a multi-layer structure in which (i) outer layers are formed from a material (such as aluminum or aluminum alloy) and (ii) an inner layer is partially formed from the same material as the outer layers and partially formed from an additional material (such as aluminum silicon carbide or thermal pyrolytic graphite). As a particular example, a structure containing aluminum silicon carbide or thermal pyrolytic graphite may be fabricated with holes, and aluminum or aluminum alloy layers may be formed around the aluminum silicon carbide or thermal pyrolytic graphite and through the holes. Among other things, fabricating the coldplate 104 using multiple layers may allow the fabrication process to use standard processing techniques. However, the coldplate 104 may be fabricated in any other suitable manner.

Note that the number of zones 114a-114c and the positions of the zones 114a-114c in the coldplate 104 are for illustration only. In FIG. 1, the zones 114a-114c of the coldplate 104 are defined based on the arrangement of electronic components 108a-108b on the substrate 106 of the circuit card assembly 102. As a result, the number of zones 114a-114c and the positions of the zones 114a-114c in the coldplate 104 may vary as needed or desired for any specific application or implementation. Also, there may be any number of CTEs in different zones of the coldplate 104.

Compared to conventional solid metal coldplates, the coldplate 104 can achieve significant weight reductions while providing improved local CTE matching. For example, a solid copper coldplate may achieve a homogenous CTE of about 17 ppm per degree Celsius and may weigh about 0.32 pounds per cubic inch (about 8.86 grams per cubic centimeter). In contrast, an example implementation of the coldplate 104 using AlSiC-9 and aluminum or aluminum alloy may provide a customizable CTE of different values in different regions but may weigh only about 0.10 pounds per cubic inch (about 2.77 grams per cubic centimeter). This is a significant reduction, and the reduction may be particularly beneficial when a large number of coldplates 104 are used in a device or system. For instance, assume that five hundred and twelve coldplates are used in a system and that each coldplate has a square shape with sides that are 5 inches (12.7 centimeters) in length and a thickness of 0.1 inches (2.54 millimeters). The overall weight of the coldplates formed of copper would be about 409.6 pounds (about 185.79 kilograms), while the overall weight of the coldplates formed of AlSiC-9 and aluminum or aluminum alloy would be about 128.0 pounds (about 58.06 pounds).

Although FIG. 1 illustrates one example of a device 100 using a tailored coldplate geometry with multiple CTE zones, various changes may be made to FIG. 1. For example, a coldplate 104 having a tailored geometry with multiple CTE zones may be used in any other suitable device or system. Also, the geometry of the coldplate 104 can vary in a number of ways, including based on the expected temperatures in different zones of a structure to be cooled.

FIGS. 2A through 2D illustrate a first example coldplate 200 having a tailored geometry with multiple CTE zones according to this disclosure. The coldplate 200 may, for example, represent one possible implementation of the coldplate 104 in the device 100 of FIG. 1. However, the coldplate 200 may be used in any other suitable device or system.

As shown in FIGS. 2A through 2D, the coldplate 200 includes a lower layer 202, an intermediate layer 204, and an upper layer 206. The lower layer 202 and the upper layer 206 may represent the outer layers of the coldplate 200 and may therefore be referred to as lower and upper skins of the coldplate 200. The intermediate layer 204 represents at least one layer of material sandwiched between or otherwise embedded non-uniformly in the material(s) forming the layers 202 and 206. At least one of the layers 202 and 206 of the coldplate 200 includes projections 208, which extend away from that layer 202 or 206. In this example, the lower layer 202 includes the projections 208, although the upper layer 206 or both layers 202 and 206 may include the projections 208. The intermediate layer 204 includes openings 210, and the projections 208 extend through the openings 210 and may couple the layers 202 and 206 together. The projections 208 are generally sized so that they fill or substantially fill the openings 210.

Figure 2A:
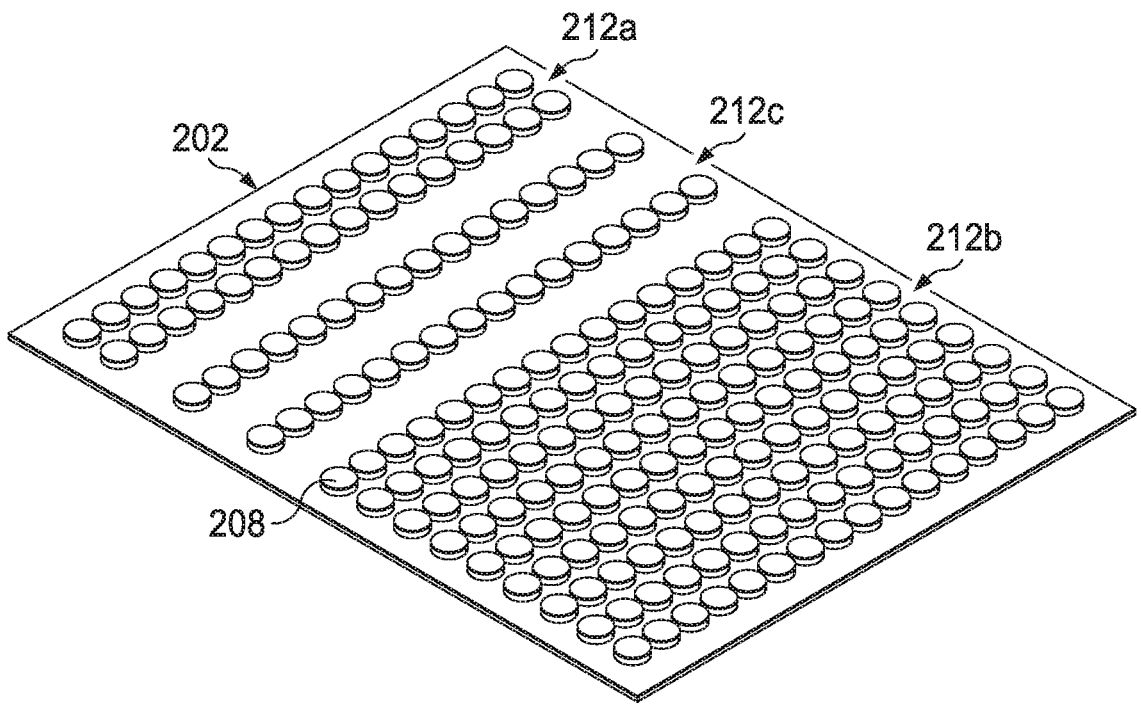
FIGS. 2A through 2D illustrate a first example coldplate having a tailored geometry with multiple CTE zones according to this disclosure.
Figure 2B:
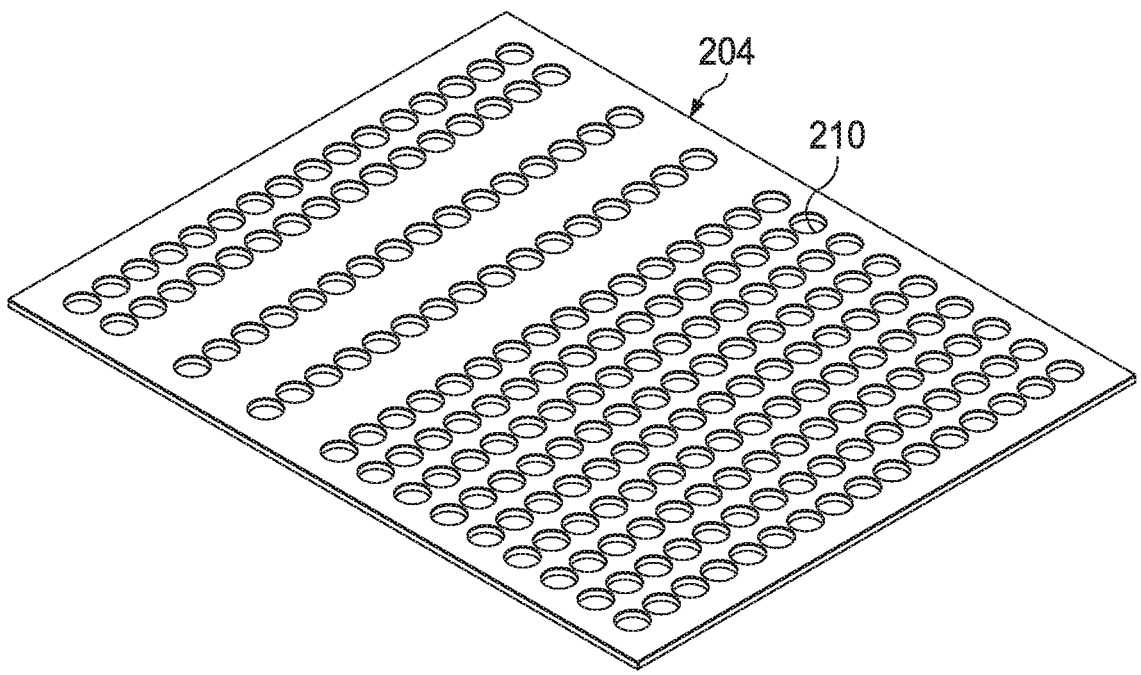
Figure 2C:
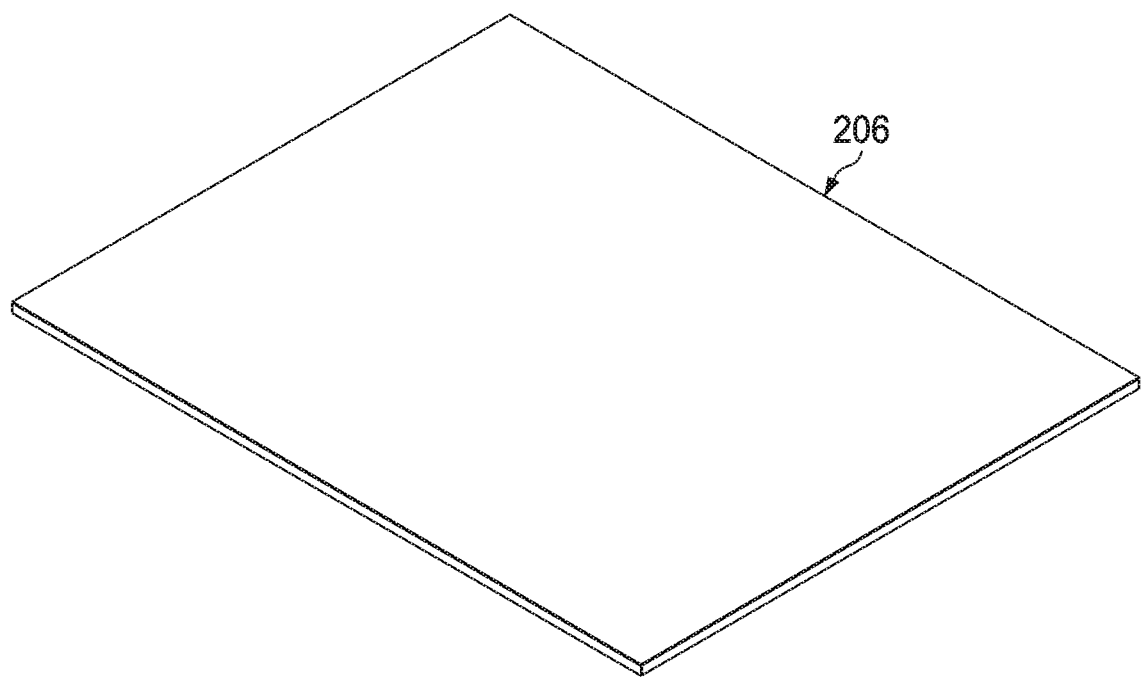
Figure 2D:
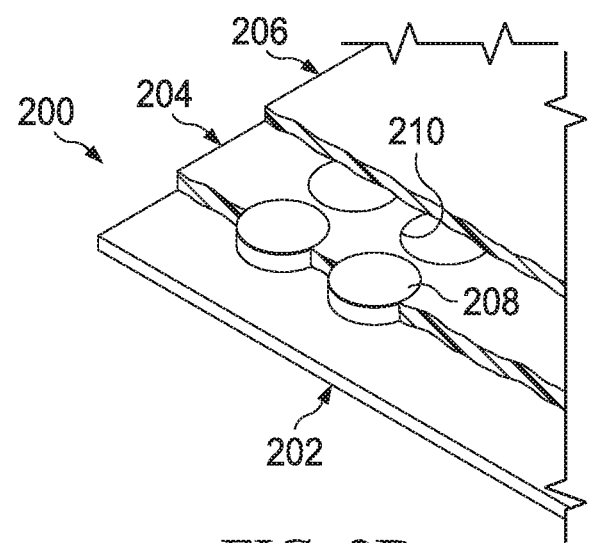

As can be seen in FIG. 2D, the layers 202, 204, 206 are placed or formed in a stack. For ease of illustration, the layers 202, 204, 206 in FIG. 2D do not completely overlap one another, although they typically would in an actual coldplate. The layers 202, 204, 206 therefore represent a multi-layer structure forming the coldplate 200. In some embodiments, each layer 202, 204, 206 may be planar or substantially planar, which can help to reduce or minimize the thickness of the coldplate 200 (and therefore reduce or minimize the bondline thickness). Note, however, that the coldplate 200 may have any other suitable size, shape, and dimensions.

The layers 202, 206 and the projections 208 are generally formed of one or more first materials, and the intermediate layer 204 is generally formed of one or more second materials, where the first and second materials have different CTEs. By controlling various characteristics of the coldplate 200, different CTEs can be obtained in different regions or zones 212a-212c of the coldplate 200. The characteristics that can be controlled here may include the locations of the projections 208 or openings 210, the number of the projections 208 or openings 210, the spacing(s) between the projections 208 or openings 210, the size(s) of the projections 208 or openings 210, the shape(s) of the projections 208 or openings 210, the dimensions of the projections 208 or openings 210, or the composition(s) of the projections 208. The characteristics that can be controlled here may also or alternatively include the thickness(es) of the layers 202, 206 or the composition(s) of the layers 202, 206.

In this example, two zones 212a-212b of the coldplate 200 include more projections 208, while a third zone 212c of the coldplate 200 includes fewer projections 208. If one or more materials forming the layers 202, 206 and the projections 208 have a higher CTE than the one or more materials forming the layer 204, this causes the zones 212a-212b to have a higher CTE compared to the zone 212c. Conversely, if one or more materials forming the layers 202, 206 and the projections 208 have a lower CTE than the one or more materials forming the layer 204, this causes the zones 212a-212b to have a lower CTE compared to the zone 212c. Note that this represents one example way in which the CTEs in different zones 212a-212c of the coldplate 200 can be tailored, but any other or additional characteristics may be varied to control the CTEs in different zones of a coldplate.

In one particular implementation of the coldplate 200, the coldplate 200 may be designed as follows. Assume that the layers 202 and 206 are formed of A356 aluminum alloy and that the layer 204 is formed of AlSiC-9. Also, assume that each layer 202, 204, 206 is about 5.216 inches (about 13.249 centimeters) square, where the layers 202 and 206 have a thickness of about 0.03 inches (about 0.762 millimeters) and the layer 204 has a thickness of about 0.04 inches (about 1.016 millimeters). Further, assume that the layer 204 includes two hundred and eight openings 210 that are circular and arranged in the pattern shown in FIG. 2B, and assume that each opening 210 is about 0.25 inches (6.35 millimeters) in diameter. Given these parameters, the volume of aluminum alloy in the coldplate 200 is about 2.04 cubic inches (about 33.43 cubic centimeters), the volume of AlSiC-9 in the coldplate 200 is about 0.68 cubic inches (about 11.14 cubic centimeters), and the total volume of the coldplate 200 is about 2.72 cubic inches (about 44.57 cubic centimeters). Also, the density of the coldplate 200 is about 0.10 pounds per cubic inch (about 2.77 grams per cubic centimeter), and the coldplate 200 is approximately 75% aluminum alloy and approximately 25% AlSiC-9. In addition, the CTE of the zones 212a-212b of the coldplate 200 may be about 19.1 ppm per degree Celsius, and the CTE of the zone 212c of the coldplate 200 may be about 16.5 ppm per degree Celsius.

In another particular implementation of the coldplate 200, the coldplate 200 may be designed as follows. Assume that the layers 202 and 206 are formed of A356 aluminum alloy and that the layer 204 is formed of AlSiC-9. Also, assume that each layer 202, 204, 206 is about 5.216 inches (about 13.249 centimeters) square, where the layers 202 and 206 have a thickness of about 0.03 inches (about 0.762 millimeters) and the layer 204 has a thickness of about 0.12 inches (about 3.048 millimeters). Further, assume that the layer 204 includes two hundred and eight openings 210 that are circular and arranged in the pattern shown in FIG. 2B, and assume that each opening 210 is about 0.25 inches (6.35 millimeters) in diameter. Given these parameters, the volume of aluminum alloy in the coldplate 200 is about 2.86 cubic inches (about 46.86 cubic centimeters), the volume of AlSiC-9 in the coldplate 200 is about 2.04 cubic inches (about 33.43 cubic centimeters), and the total volume of the coldplate 200 is about 4.90 cubic inches (about 80.30 cubic centimeters). Also, the density of the coldplate 200 is about 0.10 pounds per cubic inch (about 2.77 grams per cubic centimeter), and the coldplate 200 is approximately 58% aluminum alloy and approximately 42% AlSiC-9. In addition, the CTE of the zones 212a-212b of the coldplate 200 may be about 17.0 ppm per degree Celsius, and the CTE of the zone 212c of the coldplate 200 may be about 12.8 ppm per degree Celsius.

FIGS. 3A through 3D illustrate a second example coldplate 300 having a tailored geometry with multiple CTE zones according to this disclosure. The coldplate 300 may, for example, represent another possible implementation of the coldplate 104 in the device 100 of FIG. 1. However, the coldplate 300 may be used in any other suitable device or system.

As shown in FIGS. 3A through 3D, the coldplate 300 includes a lower layer 302, an intermediate layer 304, and an upper layer 306. The lower layer 302 and the upper layer 306 may represent the outer layers of the coldplate 300 and may again be referred to as lower and upper skins of the coldplate 300. The intermediate layer 304 represents at least one layer of material sandwiched between or otherwise embedded non-uniformly in the material(s) forming the layers 302 and 306. At least one of the layers 302 and 306 of the coldplate 300 include projections 308, which extend away from that layer 302 or 306. In this example, the lower layer 302 includes the projections 308, although the upper layer 306 or both layers 302 and 306 may include the projections 308. The intermediate layer 304 includes openings 310, and the projections 308 extend through the openings 310 and may couple the layers 302 and 306 together. The projections 308 are generally sized so that they fill or substantially fill the openings 310.

Figure 3A:
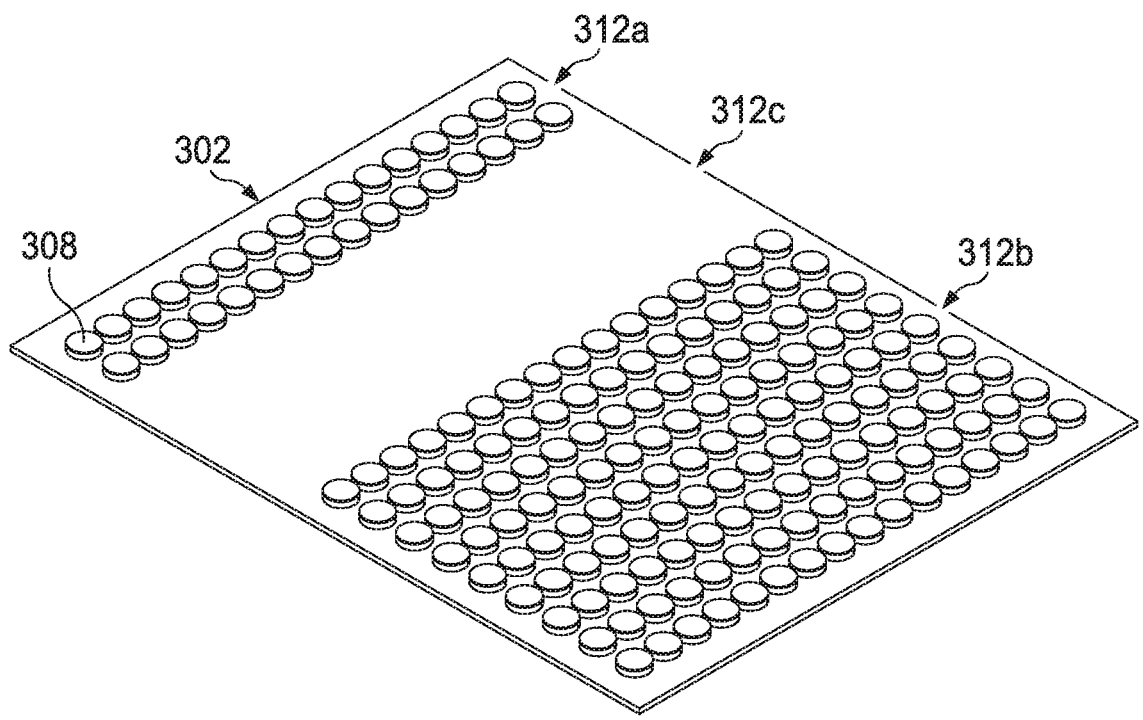
FIGS. 3A through 3D illustrate a second example coldplate having a tailored geometry with multiple CTE zones according to this disclosure.
Figure 3B:
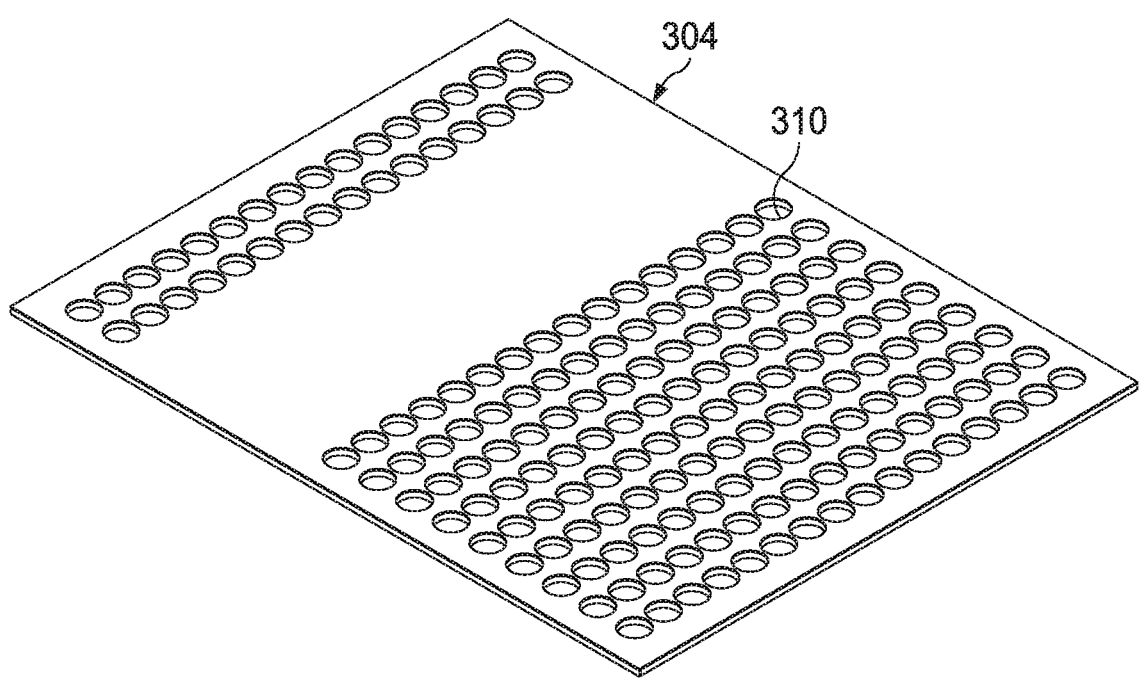
Figure 3C:
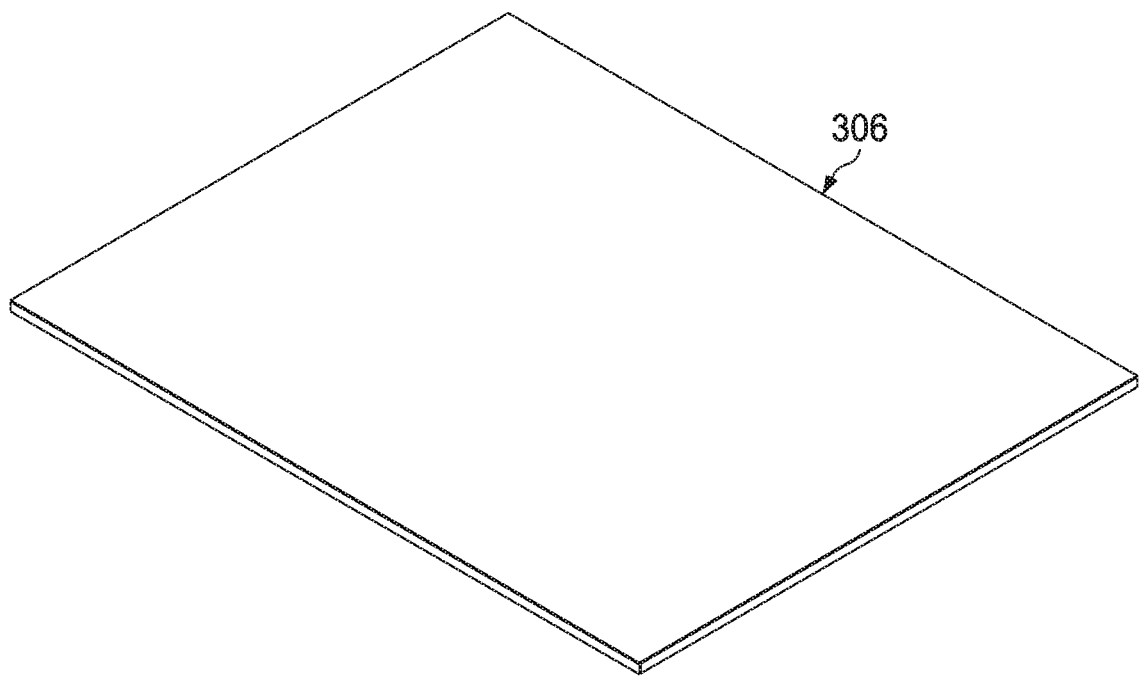
Figure 3D:
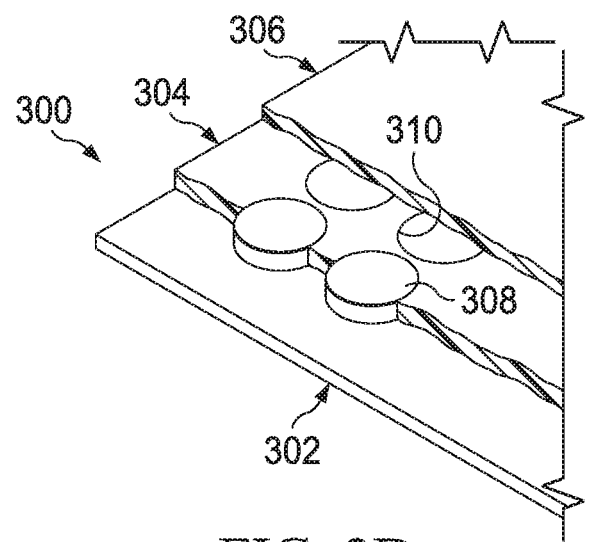

As can be seen in FIG. 3D, the layers 302, 304, 306 are placed or formed in a stack. For ease of illustration, the layers 302, 304, 306 in FIG. 3D do not completely overlap one another, although they typically would in an actual coldplate. The layers 302, 304, 306 therefore represent a multi-layer structure forming the coldplate 300. In some embodiments, each layer 302, 304, 306 may be planar or substantially planar, which can help to reduce or minimize the thickness of the coldplate 300 (and therefore reduce or minimize the bondline thickness). Note, however, that the coldplate 300 may have any other suitable size, shape, and dimensions.

The layers 302, 306 and the projections 308 are generally formed of one or more first materials, and the intermediate layer 304 is generally formed of one or more second materials, where the first and second materials have different CTEs. By controlling various characteristics of the coldplate 300, different CTEs can be obtained in different regions or zones 312a-312c of the coldplate 300. The characteristics that can be controlled here may include the locations of the projections 308 or openings 310, the number of the projections 308 or openings 310, the spacing(s) between the projections 308 or openings 310, the size(s) of the projections 308 or openings 310, the shape(s) of the projections 308 or openings 310, the dimensions of the projections 308 or openings 310, or the composition(s) of the projections 308. The characteristics that can be controlled here may also or alternatively include the thickness(es) of the layers 303, 306 or the composition(s) of the layers 303, 306.

In this example, two zones 312a-312b of the coldplate 300 include projections 308, while a third zone 312c of the coldplate 300 includes no projections 308. If one or more materials forming the layers 303, 306 and the projections 308 have a higher CTE than the one or more materials forming the layer 304, this causes the zones 312a-312b to have a higher CTE compared to the zone 312c. Conversely, if one or more materials forming the layers 303, 306 and the projections 308 have a lower CTE than the one or more materials forming the layer 304, this causes the zones 312a-312b to have a lower CTE compared to the zone 312c. Note that this represents another example way in which the CTEs in different zones 312a-312c of the coldplate 300 can be tailored, but any other or additional characteristics may be varied to control the CTEs in different zones of a coldplate.

In one particular implementation of the coldplate 300, the coldplate 300 may be designed as follows. Assume that the layers 302 and 306 are formed of A356 aluminum alloy and that the layer 304 is formed of AlSiC-9. Also, assume that each layer 302, 304, 306 is about 5.216 inches (about 13.249 centimeters) square, where the layers 302 and 306 have a thickness of about 0.03 inches (about 0.762 millimeters) and the layer 304 has a thickness of about 0.04 inches (about 1.016 millimeters). Further, assume that the layer 304 includes one hundred and seventy six openings 310 that are circular and arranged in the pattern shown in FIG. 3B, and assume that each opening 310 is about 0.25 inches (6.35 millimeters) in diameter. Given these parameters, the volume of aluminum alloy in the coldplate 300 is about 1.90 cubic inches (about 31.14 cubic centimeters), the volume of AlSiC-9 in the coldplate 300 is about 0.82 cubic inches (about 13.44 cubic centimeters), and the total volume of the coldplate 300 is about 2.72 cubic inches (about 44.57 cubic centimeters). Also, the density of the coldplate 300 is about 0.10 pounds per cubic inch (about 2.77 grams per cubic centimeter), and the coldplate 300 is approximately 70% aluminum alloy and approximately 30% AlSiC-9. In addition, the CTE of the zones 312a-312b of the coldplate 300 may be about 17.0 ppm per degree Celsius, and the CTE of the zone 312c of the coldplate 300 may be about 14.1 ppm per degree Celsius.

As can be seen in the two examples above, various coldplates can be designed and tailored to achieve desired thermal performances. Each coldplate can be designed to have any suitable number of regions or zones with different CTEs, and the regions or zones of each coldplate can be tailored to have desired CTEs through the adjustment or control of various characteristics of the coldplate. The above examples have illustrated some example ways in which certain CTEs in the regions or zones of the coldplates can be achieved, although CTEs can be tailored in any suitable manner to achieve any suitable values as needed or desired. In addition, the number and arrangement of the regions or zones with different CTEs in a coldplate can vary as needed or desired and may typically be based (at least in part) on the structure to be cooled using the coldplate. Thus, for instance, warmer regions or zones of the structure to be cooled may have corresponding regions or zones in the coldplate with lower CTEs, and cooler regions or zones of the structure to be cooled may have corresponding regions or zones in the coldplate with higher CTEs.

The coldplates 200, 300 shown in FIGS. 2A though 3D or other coldplates designed in accordance with this disclosure may be fabricated in any suitable manner. For example, the various layers 202-206, 302-306 of each coldplate 200, 300 may be fabricated separately and then bonded or otherwise connected together, or the various layers 202-206, 302-306 of each coldplate 200, 300 may be fabricated to form an integral or monolithic structure. As a particular example, the intermediate layer 204, 304 of a coldplate 200, 300 may be fabricated, such as by forming a layer of AlSiC or other material(s) and etching the material(s) to form the openings 210, 310. One or more other materials (such as aluminum or aluminum alloy) may then be deposited or otherwise formed around the intermediate layer 204, 304 and through the openings 210, 310 to form the layers 202, 206 or 302, 306 and the projections 208, 308 that extend through the openings 210, 310. Note, however, that each of the coldplates 200, 300 may be fabricated in any other suitable manner.

Although FIGS. 2A though 3D illustrate two examples of coldplates 200 and 300 having tailored geometries with multiple CTE zones, various changes may be made to FIGS. 2A through 3D. For example, each individual component of the coldplates 200 and 300 may have any suitable size, shape, and dimensions, and each coldplate 200 and 300 overall may have any suitable size, shape, and dimensions. Also, while specific materials may be described above as being used in the coldplates 200 and 300, the coldplates 200 and 300 may be fabricated from any other suitable materials, such as any suitable combination of materials in which different materials have different CTEs.

Figure 4:
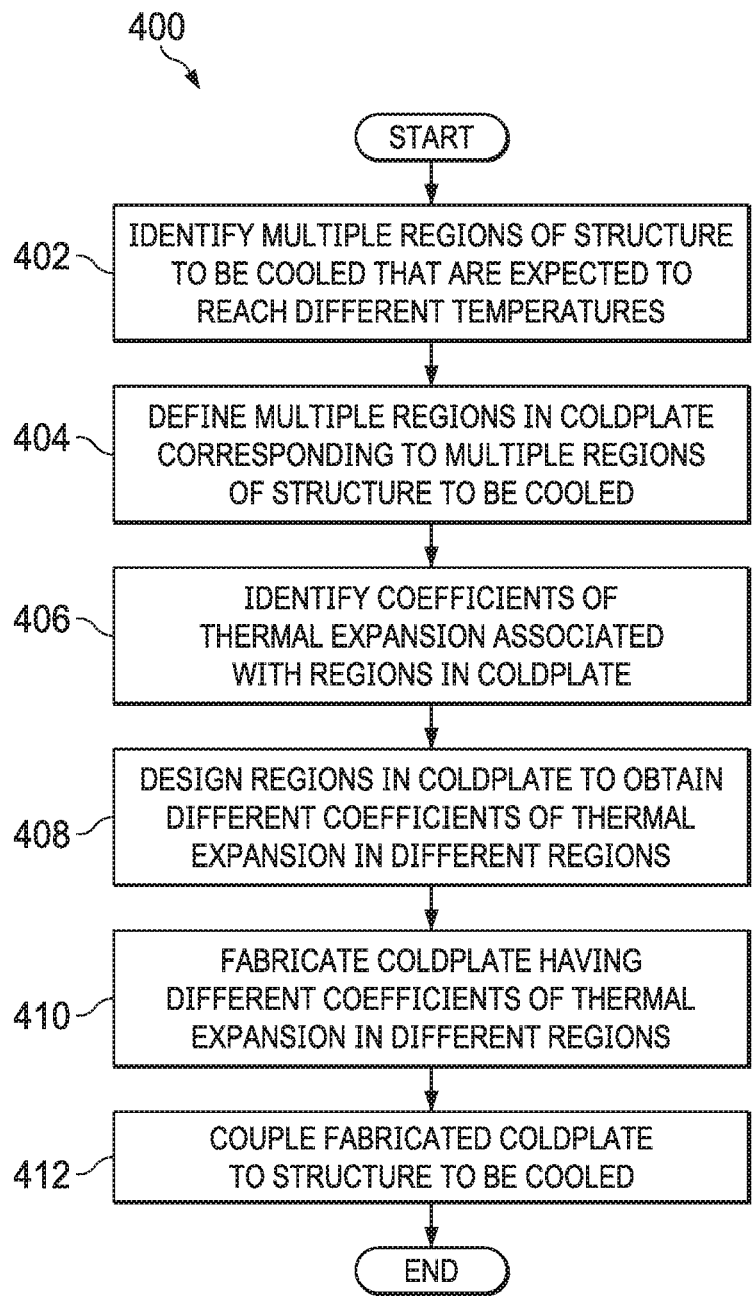
FIG. 4 illustrates an example method for tailoring a coldplate geometry to form multiple CTE zones according to this disclosure.

FIG. 4 illustrates an example method 400 for tailoring a coldplate geometry to form multiple CTE zones according to this disclosure. For ease of explanation, the method 400 shown in FIG. 4 may be described as involving the coldplates 200, 300 of FIGS. 2A through 3D, which may be designed for use in or with the device 100 of FIG. 1. However, the method 400 shown in FIG. 4 may involve any suitable coldplate that is designed for use with any suitable device or system.

As shown in FIG. 4, multiple regions of a structure to be cooled that are expected to reach different (and possibly significantly different) temperatures during operation are identified at step 402. This may include, for example, using the design of an electronic device, simulation tools, or any other suitable approaches to identify different regions or zones of a structure that are expected to reach different temperatures during operation of the structure. As a particular example, this may include identifying different zones 110a-110c of a substrate 106 in a circuit card assembly 102 that are expected to reach different temperatures, such as due to the presence or absence of different types of electronic components 108a-108b in or on the substrate 106.

Multiple regions in a coldplate corresponding to the multiple regions of the structure to be cooled are defined at step 404, and CTEs associated with the multiple regions in the coldplate are identified at step 406. This may include, for example, defining different portions of a coldplate 104, 200, 300 that should have different CTEs in order to account for the different expected temperatures of the structure to be cooled. As a particular example, this may include identifying different zones 114a-114c, 212a-212c, 312a-312c of a coldplate 104, 200, 300, where the different zones of the coldplate may generally align with and be attached to the corresponding zones 110a-110c of the substrate 106 in the circuit card assembly 102.

The different regions of the coldplate are designed to obtain different CTEs in those regions at step 408. This may include, for example, designing the different regions of the coldplate 104, 200, 300 to include certain characteristics that help to control or define the CTEs in those regions of the coldplate. As described above, various characteristics may be used to control the CTE in a region of a coldplate. Example characteristics may include the locations of the projections 208, 308 or openings 210, 310, the number of the projections 208, 308 or openings 210, 310, the spacing(s) between the projections 208, 308 or openings 210, 310, the size(s) of the projections 208, 308 or openings 210, 310, the shape(s) of the projections 208, 308 or openings 210, 310, the dimensions of the projections 208, 308 or openings 210, 310, the composition(s) of the projections 208, 308, the thickness(es) of the layers 202, 206, 302, 306, or the composition(s) of the layers 202, 206, 302, 306. One or any suitable combination of these characteristics may be used here to design the different zones 114a-114c, 212a-212c, 312a-312c of the coldplate 104, 200, 300. Ideally, the CTEs in the regions of the designed coldplate match or closely match the CTEs identified at step 406, although in practice there is typically some variance.

A coldplate having the different CTEs in the different regions is fabricated at step 410. This may include, for example, fabricating the intermediate layer 204, 304 of each coldplate 104, 200, 300 (such as by depositing and etching a suitable material or materials) and forming the layers 202, 206, 302, 306 around and through the intermediate layer 204, 304. Note, however, that the particular operations used to fabricate the individual components or groups of components of the coldplate 104, 200, 300 can vary as needed or desired. The fabricated coldplate is coupled to the structure to be cooled at step 412. This may include, for example, thermally coupling the coldplate 104, 200, 300 to the substrate 106 of the circuit card assembly 102, such as via the use of a thermal adhesive, lamination, or other bonding technique.

Although FIG. 4 illustrates one example of a method 400 for tailoring a coldplate geometry to form multiple CTE zones, various changes may be made to FIG. 4. For example, while shown as a series of steps, various steps in FIG. 4 may overlap, occur in parallel, occur in a different order, or occur any number of times. As a particular example, multiple instances of the designed coldplate may be fabricated for multiple instances of the structure to be cooled. Also, the design of a coldplate may be obtained in any other suitable manner, and any suitable characteristic(s) of the coldplate may be used to control the CTEs in the different regions or zones of the coldplate.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
  a coldplate configured to be thermally coupled to a structure to be cooled and to remove thermal energy from the structure;
  wherein the coldplate comprises:
    first and second outer layers comprising at least one first material; and
    a third layer embedded in the first and second outer layers and comprising at least one second material;
  wherein the first and second materials have different coefficients of thermal expansion (CTEs);
  wherein the third layer is embedded non-uniformly in the first and second outer layers so that different zones of the coldplate have different local CTEs; and
  wherein the different zones of the coldplate having the different local CTEs are defined based on different regions of the structure that reach different temperatures.

2. The apparatus of claim 1, wherein:
  the third layer comprises openings extending through the at least one second material; and
  projections of the at least one first material from at least one of the first and second outer layers partially or completely fill the openings.

3. The apparatus of claim 2, wherein the local CTEs of the different zones of the coldplate are based at least partially on at least one of:
  locations of the openings or the projections;
  a number of the openings or the projections;
  one or more spacings between the openings or the projections;
  one or more sizes of the openings or the projections;
  one or more shapes of the openings or the projections;
  one or more dimensions of the openings or the projections; or
  one or more compositions of the projections.

4. The apparatus of claim 2, wherein:
  a first of the zones of the coldplate has a first of the local CTEs based at least partially on a first specified number of projections in the first zone; and
  a second of the zones of the coldplate has a second of the local CTEs based at least partially on one of: (i) a second specified number of projections in the second zone that is less than the first specified number or (ii) no projections in the second zone.

5. The apparatus of claim 1, wherein the local CTEs of the different zones of the coldplate are based at least partially on at least one of:
  one or more dimensions of the first and second outer layers; and
  one or more compositions of the first and second outer layers.

6. The apparatus of claim 1, wherein:
  the first and second outer layers comprise aluminum or an aluminum alloy; and
  the third layer comprises aluminum silicon carbide or thermal pyrolytic graphite.

7. The apparatus of claim 1, wherein the first, second, and third layers are substantially planar.

8. The apparatus of claim 1, wherein:
  a first of the zones of the coldplate has a lower CTE and is associated with a first of the regions of the structure expected to reach higher temperatures; and a second of the zones of the coldplate has a higher CTE and is associated with a second of the regions of the structure expected to reach lower temperatures.

9. A system comprising:
an electronic device comprising a substrate and multiple electronic components in or on the substrate; and
a coldplate thermally coupled to the substrate and configured to remove thermal energy from the substrate;
wherein the coldplate comprises:
first and second outer layers comprising at least one first material; and
a third layer embedded in the first and second outer layers and comprising at least one second material;
wherein the first and second materials have different coefficients of thermal expansion (CTEs);
wherein the third layer is embedded non-uniformly in the first and second outer layers so that different zones of the coldplate have different local CTEs;
wherein the electronic components are configured to cause different regions of the substrate to reach different temperatures during operation of the electronic device; and
wherein the different zones of the coldplate having the different local CTEs are defined based on the different regions of the substrate.

10. The system of claim 9, wherein:
a first of the zones of the coldplate has a lower CTE and is associated with a first of the regions of the substrate expected to reach higher temperatures during operation of the electronic device; and
a second of the zones of the coldplate has a higher CTE and is associated with a second of the regions of the substrate expected to reach lower temperatures during operation of the electronic device.

11. The system of claim 9, wherein:
the third layer comprises openings extending through the at least one second material; and
projections of the at least one first material from at least one of the first and second outer layers partially or completely fill the openings.

12. The system of claim 11, wherein the local CTEs of the different zones of the coldplate are based at least partially on at least one of:
locations of the openings or the projections;
a number of the openings or the projections;
one or more spacings between the openings or the projections;
one or more sizes of the openings or the projections;
one or more shapes of the openings or the projections;
one or more dimensions of the openings or the projections; or
one or more compositions of the projections.

13. The system of claim 11, wherein:
a first of the zones of the coldplate has a first of the local CTEs based at least partially on a first specified number of projections in the first zone; and
a second of the zones of the coldplate has a second of the local CTEs based at least partially on one of: (i) a second specified number of projections in the second zone that is less than the first specified number or (ii) no projections in the second zone.

14. The system of claim 9, wherein the local CTEs of the different zones of the coldplate are based at least partially on at least one of:
one or more dimensions of the first and second outer layers; and
one or more compositions of the first and second outer layers.

15. The system of claim 9, wherein:
the first and second outer layers comprise aluminum or an aluminum alloy; and
the third layer comprises aluminum silicon carbide or thermal pyrolytic graphite.

16. The system of claim 9, wherein the first, second, and third layers are substantially planar.

17. A method comprising:
obtaining a coldplate that comprises:
first and second outer layers comprising at least one first material; and
a third layer embedded in the first and second outer layers and comprising at least one second material;
wherein the first and second materials have different coefficients of thermal expansion (CTEs); and
wherein the third layer is embedded non-uniformly in the first and second outer layers so that different zones of the coldplate have different local CTEs; and
thermally coupling the coldplate to a structure to be cooled, the coldplate configured to remove thermal energy from the structure;
wherein the different zones of the coldplate having the different local CTEs are defined based on different regions of the structure that reach different temperatures.

18. The method of claim 17, wherein:
the third layer comprises openings extending through the at least one second material; and
projections of the at least one first material from at least one of the first and second outer layers partially or completely fill the openings.

19. The method of claim 18, further comprising:
designing the coldplate so that the local CTEs of the different zones of the coldplate are based at least partially on at least one of:
locations of the openings or the projections;
a number of the openings or the projections;
one or more spacings between the openings or the projections;
one or more sizes of the openings or the projections;
one or more shapes of the openings or the projections;
one or more dimensions of the openings or the projections; or
one or more compositions of the projections.

20. The method of claim 17, further comprising:
designing the coldplate so that the local CTEs of the different zones of the coldplate are based at least partially on at least one of:
one or more dimensions of the first and second outer layers; and
one or more compositions of the first and second outer layers.

* * * * *